(12) United States Patent
Kim et al.

(10) Patent No.: US 10,312,050 B2
(45) Date of Patent: Jun. 4, 2019

(54) HOLDER DEVICE FOR ELECTRON MICROSCOPE

(71) Applicant: SNU R&DB Foundation, Seoul (KR)

(72) Inventors: Young Woon Kim, Seoul (KR); Sung Dae Kim, Seoul (KR)

(73) Assignee: SNU R&DB Foundation (KR)

( * ) Notice: Subject to any disclaimer, the term of this patent is extended or adjusted under 35 U.S.C. 154(b) by 1094 days.

(21) Appl. No.: 14/420,722

(22) PCT Filed: Aug. 8, 2013

(86) PCT No.: PCT/KR2013/007170
§ 371 (c)(1),
(2) Date: Feb. 10, 2015

(87) PCT Pub. No.: WO2014/054852
PCT Pub. Date: Apr. 10, 2014

(65) Prior Publication Data
US 2015/0235802 A1  Aug. 20, 2015

(30) Foreign Application Priority Data

Oct. 4, 2012 (KR) ........................ 10-2012-0109933
Aug. 1, 2013 (KR) ........................ 10-2013-0091603

(51) Int. Cl.
*H01J 37/20* (2006.01)
*H01J 37/22* (2006.01)
*H01J 37/26* (2006.01)

(52) U.S. Cl.
CPC ............ *H01J 37/20* (2013.01); *H01J 37/226* (2013.01); *H01J 37/228* (2013.01); *H01J 37/26* (2013.01);
(Continued)

(58) Field of Classification Search
USPC ....................................... 250/440.11, 442.11
See application file for complete search history.

(56) References Cited

U.S. PATENT DOCUMENTS 6,967,335 B1  11/2005  Dyer et al.
7,968,846 B2   6/2011  Talghader et al.
(Continued)

FOREIGN PATENT DOCUMENTS

JP   2002-162350 A   6/2002
JP   2003-139703 A   5/2003
(Continued)

OTHER PUBLICATIONS

WIPO, International Search Report (PCT/KR2013/007170), dated Dec. 2, 2013.
(Continued)

*Primary Examiner* — Kiet T Nguyen
(74) *Attorney, Agent, or Firm* — Park & Associates IP Law, P.C.

(57) ABSTRACT

Disclosed is a holder device for an electron microscope, which efficiently collects light emitted when electrons collide with a sample inside the electron microscope and is selectively usable in various electron microscopes since it can be easily attached to and detached from the electron microscopes. The holder device includes a frame; a sample support block configured to be supported on the frame and comprising a sample mounting portion to support an edge of a sample; a mirror unit configured to comprise an upper mirror and a lower mirror respectively arranged above and below the sample and reflect light radiating from the sample, which is mounted to the sample mounting portion and to which an electron beam is emitted, in a predetermined direction; a condensing lens configured to condense light from the mirror unit on a predetermined target; and an optical fiber configured to collect light from the condensing lens.

7 Claims, 5 Drawing Sheets

(52) U.S. Cl.
CPC ..... *H01J 37/261* (2013.01); *H01J 2237/2007* (2013.01); *H01J 2237/2602* (2013.01); *H01J 2237/2808* (2013.01)

(56) References Cited

U.S. PATENT DOCUMENTS

| | | | |
|---|---|---|---|
| 8,581,207 B2 | 11/2013 | Kim et al. | |
| 2012/0293791 A1* | 11/2012 | Milas | H01J 37/20 356/72 |
| 2013/0141803 A1* | 6/2013 | Galloway | H01J 37/228 359/726 |
| 2017/0069458 A1* | 3/2017 | Shouji | H01J 37/20 |

FOREIGN PATENT DOCUMENTS

| | | |
|---|---|---|
| JP | 2009-123477 A | 6/2009 |
| JP | 2009-538425 A | 11/2009 |
| JP | 2011-175908 A | 9/2011 |
| JP | 2012-109115 A | 6/2012 |
| KR | 10-2005-0021987 A | 3/2005 |
| WO | 2011/030156 A2 | 3/2011 |
| WO | 2013/101379 A1 | 7/2013 |

OTHER PUBLICATIONS

Extended European Search Report (EP 13843302.4), EPO, dated May 13, 2016.

* cited by examiner

HOLDER DEVICE FOR ELECTRON MICROSCOPE

REFERENCE TO RELATED APPLICATIONS

This application is a U.S. National Phase application of International Patent Application PCT/KR2013/007170 filed on Aug. 8, 2013, which designates the United States and claims priority of Korean Patent Application No. 10-2012-0109933 filed on Oct. 4, 2012, and Korean Patent Application No. 10-2013-0091603 filed on Aug. 1, 2013, the entire contents of which are incorporated herein by reference.

FIELD OF THE INVENTION

The present invention relates to a holder device for an electron microscope.

BACKGROUND OF THE INVENTION

To ascertain a band gap of the material, there is a need of collecting and analyzing light caused by cathodoluminescence, which occurs when an electron beam is applied to a material. In general, the collection of the light based on the cathodeluminescence is performed inside an electron microscope, and thus the electron microscope includes a main tube mounted with additional elements such as a reflection mirror needed for collecting the cathodoluminescence light.

A conventional electron microscope capable of collecting the cathodoluminescence is relatively bulky and complicated and pretty expensive because of the additional elements. Further, there is a limit that the cathodoluminescence is collectable in only the electron microscope having such a function. However, the conventional electron microscope mounted with the elements for collecting the cathodoluminescence has a structure of collecting the cathodoluminescence generated from one surface of a sample, and therefore obtained information is relatively small in quantity and not accurate.

SUMMARY OF THE INVENTION

An aspect of the invention is to provide a holder device for an electron microscope, in which elements needed for collecting cathodoluminescence are modularized into a compact unit and universally applicable to commercialized electron microscopes, and have a high efficiency of collecting cathodoluminescence.

The foregoing and/or other aspects of the present invention are achieved by providing a holder device for an electron microscope including: a frame; a sample support block configured to be supported on the frame and include a sample mounting portion to support an edge of a sample; a mirror unit configured to include an upper mirror and a lower mirror which are respectively arranged above and below the sample and reflect light radiating from the sample, which is mounted to the sample mounting portion and to which an electron beam is emitted, in a predetermined direction; a condensing lens configured to condense light from the mirror unit on a predetermined target; and an optical fiber configured to collect light from the condensing lens.

The mirror unit may include a sample approach slit configured to be arranged in between the upper mirror and the lower mirror and allow the sample mounting portion to move in and out along a surface of the sample.

The mirror unit may include an electron through hole via which the electron beam emitted to the sample passes.

The condensing lens may be supported on the mirror unit so that it allows high efficiency of collecting light and stability of fixing lens.

The holder device for an electron microscope may further include: an optical fiber holder configured to hold the optical fiber; and a coupler configured to couple the optical fiber holder and the mirror unit.

The coupler may be movably supported on the frame so that the mirror unit can reciprocate between an inspection position where the sample mounting portion is placed within the mirror unit and an idle position where the sample mounting portion is separated from the mirror unit. With these configurations, it is available to perform various different analysis using the electron microscope.

A slide pin extended in parallel with a lengthwise direction of the frame may be coupled to one of the mirror unit and the sample support block, and a guide may be provided in the other of the mirror unit and the sample support block and guides the slide pin to slide relatively. With these configurations, it is stable for mobility of the mirror unit.

The holder device for an electron microscope may further include: a support rod configured to include one end portion to which the frame is detachably coupled and an axial hole through which the optical fiber passes; and a grip portion configured to be provided at the other end portion of the support rod.

According to an exemplary embodiment, there is provided a holder device for an electron microscope, which has a shape similar to a sample support holder used in a general electron microscope and has a compact structure universally installable and usable in various electron microscopes without an environmental limit of given equipment. Further, this holder device for an electron microscope has a high efficiency of collecting cathodoluminescence since mirrors are arranged at both sides of a sample.

For reference, numerals in drawings are as follows.

| | |
|---|---|
| 1: Head | 10: Support Rod |
| 11: Grip | 20: Frame |
| 21: Fixture | 22: Frame Arm |
| 23: Mounting Screw | 24: Adjustment Screw |
| 30: Sample Support Block | 31: Holding Block |

-continued

32: Protrusion
34: Bridge
35: Sample Mounting Portion
36: Slide Insertion Hole
37: Mounting Raised Portion
38: Copper Tube Hold Portion
39: Mounting Hole
40: Optical Fiber
50: Coupler
53: Optical Fiber Insertion Hole
60: Lens
70: Mirror Unit
72: Guide Insertion Portion
73: Sample Approach Slit
74: Lens Mounting Portion
76: Upper Mirror Surface
78: Lower Mirror Surface
80: Slide Guide
90: Sample
91: Sample Arrangement Pin 33: Fastening Hole 41: Copper Tube 51: Optical Fiber Holder 71: Electron Through Hole 75: Upper Mirror Portion
77: Lower Mirror Portion
79: Extended Portion
81: Slide Guide Hole

DETAILED DESCRIPTION OF THE INVENTION

Figure 1:
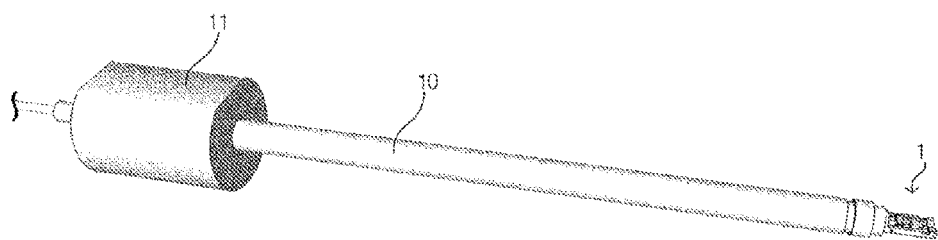
FIG. 1 is a perspective view showing a holder device for an electron microscope according to an exemplary embodiment.

FIG. 1 is a perspective view showing a holder device for an electron microscope according to an exemplary embodiment. As shown in FIG. 1, the holder device is provided in the form of a long rod, and includes a support rod 10 to be inserted in the electron microscope, and a holder grip 11 coupled to one end portion of the support rod 10 and fixed to a main body of the electron microscope so as to be gripped by a worker. Further, a head 1 is mounted to the other end portion of the support rod 10 so as to support a sample 90 to be analyzed and collect cathodoluminescence generated in the sample 90.

Figure 2:
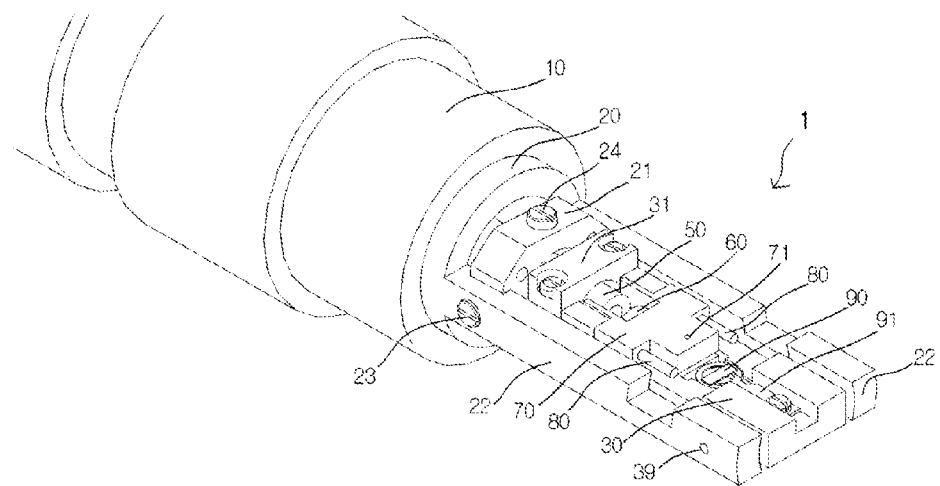
FIGS. 2 to 4 are assembled views and a partial exploded perspective view of a head, which are to explain a head portion of a holder device for an electron microscope according to an exemplary embodiment.
Figure 3:
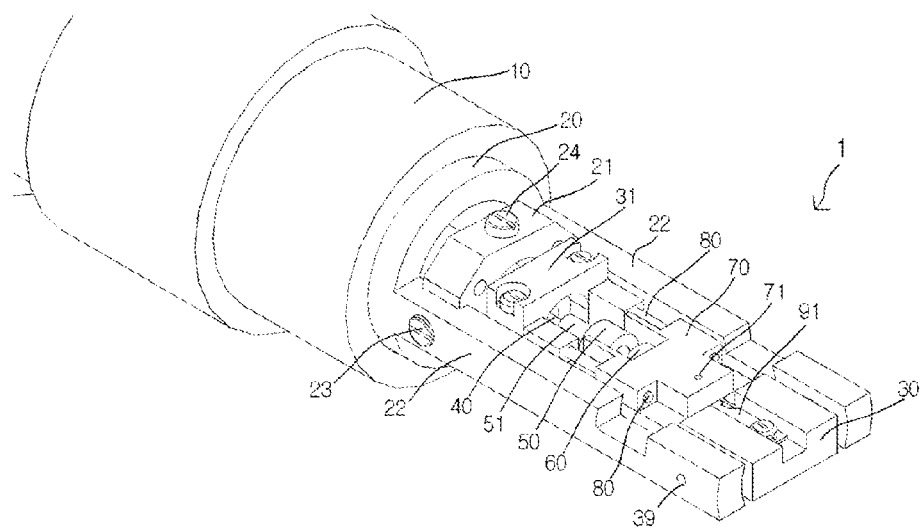
Figure 4:
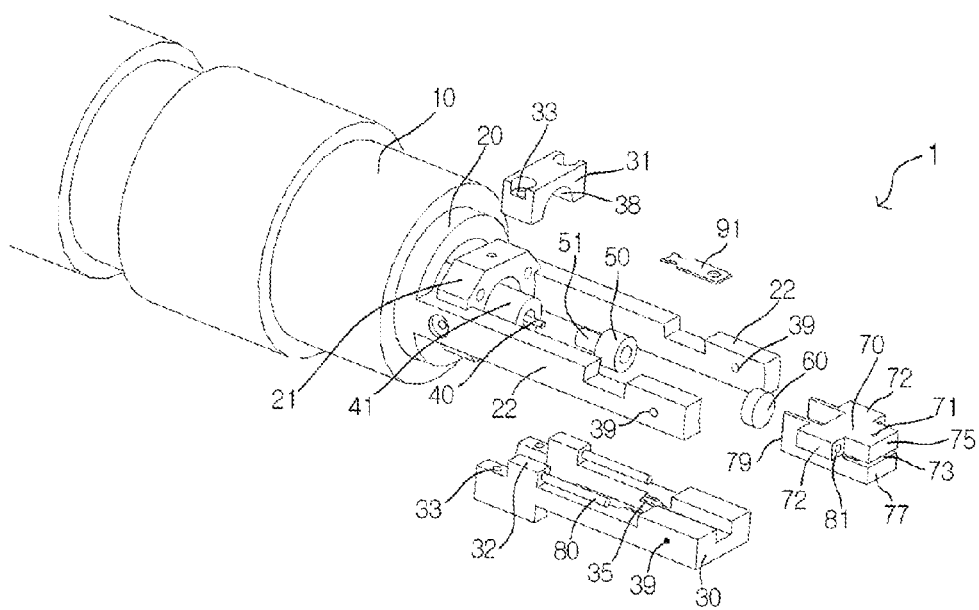

FIGS. 2 to 4 are assembled views and a partial exploded perspective view of the head 1, which are to explain the head 1 of the holder device for an electron microscope according to an exemplary embodiment. As shown therein, the head 1 includes a frame 20 coupled to the support rod 10. The frame 20 is coupled to an end of the support rod 10 and includes a pair of frame arms 22 extended in parallel with each other in a lengthwise direction of the support rod 10. The support rod 10 is shaped like a tube and accommodates a copper tube 41 in its axial direction, and an optical fiber 40 penetrates the copper tube 41 in the axial direction.

The copper tube 41 is exposed at the end of the support rod 10 and extended to a region of the frame arms 22. A fixture 21 for fixing the position of the copper tube 41 is installed to the frame arms 22 by a mounting screw 23. The fixture 21 includes a through hole formed in the axial direction of the support rod 10, and the copper tube 41 is coaxially accommodated in the through hole of the fixture 21. Further, adjustment screws 24 opposite to each other are inserted in the fixture 21 in a radial direction, and thus stably fix the copper tube 41 on to a central axis in which a light beam travels.

One end of the optical fiber 40 accommodated in the copper tube 41 is inserted in and coupled to an optical fiber holder 51 shaped like a tube. The optical fiber holder 51 is coaxially and integrally coupled to a coupler 50 shaped like a tube having a relatively large diameter. The other end of the optical fiber 40 is connected to an external device of the electron microscope.

Figure 5:
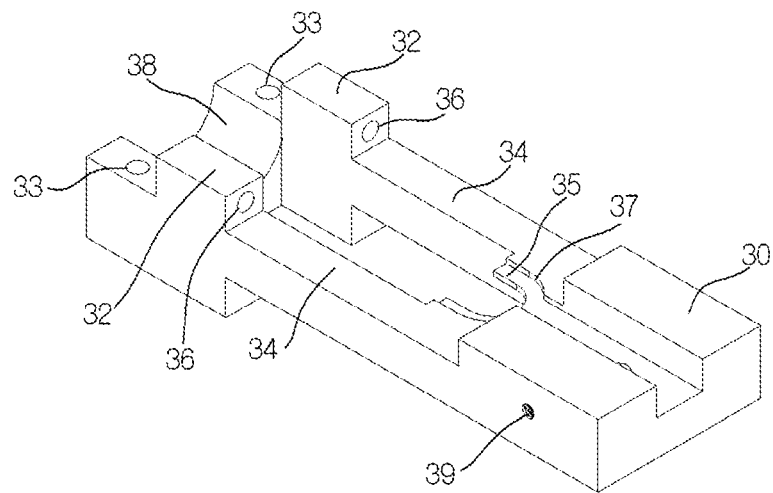
FIGS. 5 and 6 are perspective views for explaining a sample support block and an assembly relationship between the sample support block and a mirror unit according to an exemplary embodiment.

A sample support block 30 is installed in between both the frame arms 22. Referring to the enlarged perspective views of FIGS. 5 and 6 together with FIGS. 2 to 4, the sample support block 30 includes a sample mounting portion 35 for supporting an edge of the sample 90, and a copper tube hold portion 38 for accommodating about half of the exterior of the copper tube 41. The sample mounting portion 35 and the copper tube hold portion 38 are connected by a pair of bridges 34 extended in parallel in the longitudinal direction of the sample support block 30. There is an opened area in between the pair of bridges 34.

The sample mounting portion 35 has a semicircular shape and supports an edge of a sample. There is a hole in a center portion of the sample mounting portion 35 so that an electron beam can pass through the center portion. The sample mounting portion 35 is formed with a mounting raised portion 37 having a height corresponding to a thickness of a sample 90 so that the sample 90 can be stably mounted thereto. If a sample 90 is stably mounted to the sample mounting portion 35, the sample 90 is fixed by the sample arrangement pin 91.

The copper tube hold portion 38 has a curved shape to receive the copper tube 41. A hold block 31 including a copper tube hold portion 38 having a curved shape corresponding to the copper tube hold portion 38 is coupled to the sample support block 30 by screws inserted into a pair of fastening holes 33, leaving the copper tube 41 between the hold block 31 and the sample support block 30.

Mounting holes 39 are formed by penetrating end portions of the sample support block 30 and the frame arms 22 in a traverse direction to the axial direction. By inserting an arrangement fin to the mounting holes 39, the pair of frame arms 22 and the sample support block 30 are coupled.

A pair of protrusions 32 is formed in a region of bridges 34 contacting the copper tube hold portion 38 and protrudes by a predetermined height in a height direction. Each protrusion 32 is formed with a slide insertion hole 36 in the axial direction so that a slide guide 80 can be inserted in the slide insertion hole 36. The slide guide 80 inserted in and coupled to the slide insertion hole 36 in the axial direction is accommodated in a mirror unit 70 and guides movement of the mirror unit 70.

The mirror unit 70 includes a sample approach slit 73 allowing the sample mounting portion 35 to move in and out along a surface of a sample 90, and an upper mirror portion 75 and a lower mirror portion 77 divided with the sample approach slit 73 therebetween. On the top surface of the upper mirror portion 75 is formed an electron through hole 71 to which an electron beam is emitted. The electron through hole 71 is formed by straightly penetrating the upper mirror portion 75 and the lower mirror portion 77 in the height direction. An extended portion 79 is provided at an axial opposite side of the upper mirror portion 75 and the lower mirror portion 77 and extended to have a predetermined length in the state that the upper portion is opened. A region, where the extended portion 79 starts being extended from the upper mirror portion 75 and the lower mirror portion 77, serves as a lens mounting portion 74 to which a lens 60 is mounted.

A guide insertion portion 72 is provided at the lateral sides of the mirror unit 70 and protrudes in lateral directions. The guide insertion portion 72 is formed with a slide guide hole 81 penetrated in the axial direction so as to receive a slide guide 80.

Figure 6:
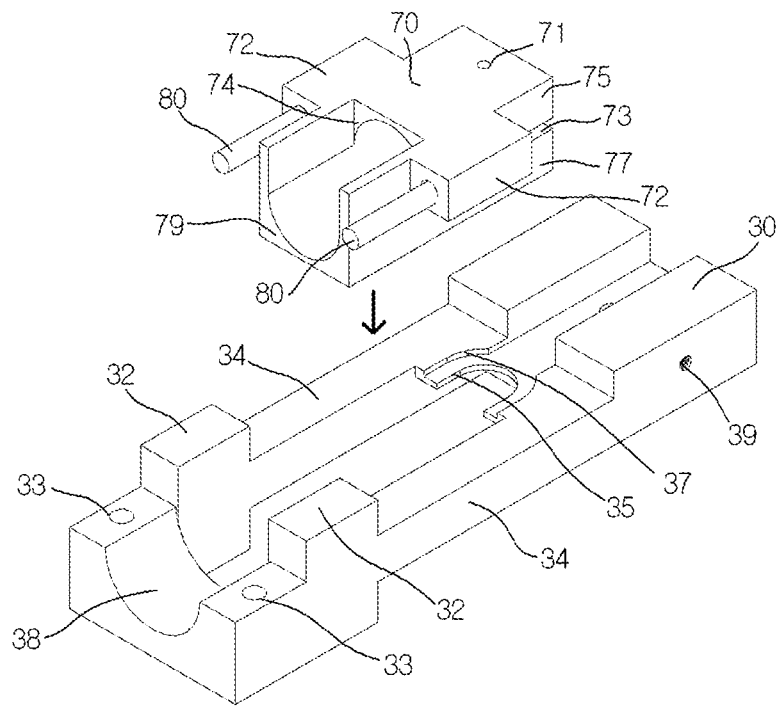

As shown in FIG. 6, in the state that the slide guide 80 is inserted in the slide guide hole 81, the mirror unit 70 moves down in the height direction of the sample support block 30 and is then inserted in the opened area between the bridges 34. Thus, a lower portion of the lower mirror portion 77 is inserted in the opened area between the bridge 34, and the pair of guide insertion portions 72 are supported on the pair of bridges 34.

In such a state that the guide insertion portions 72 are supported on the sample support block 30, the slide guide 80 is inserted and fixed in the slide insertion hole 36. Therefore, the mirror unit 70 can lengthwise reciprocate along the slide guide 80.

Figure 7:
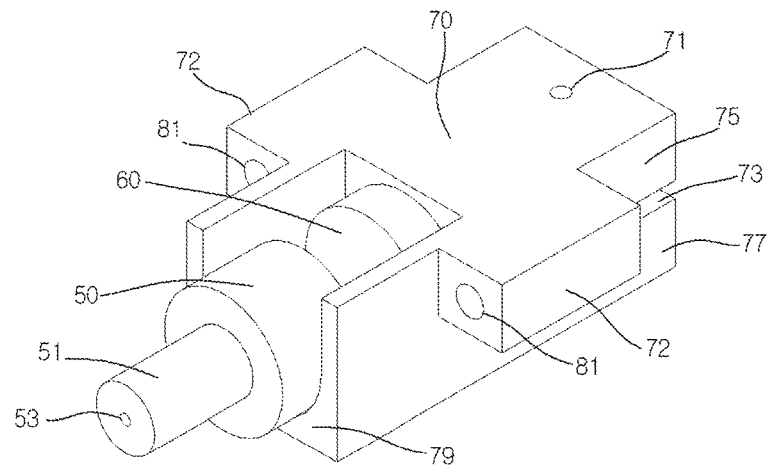
FIG. 7 is a perspective view showing a coupling relationship among the mirror unit, a lens and a coupler according to an exemplary embodiment.

FIG. 7 is a perspective view showing a coupling relationship among the mirror unit 70, the lens 60 and a coupler 50 according to an exemplary embodiment. As shown in FIG. 7, the lens 60 is supported on the lens mounting portion 74. The lens 60 serves to condense light reflected from an upper mirror surface 76 and a lower mirror surface 78 on an end surface of the optical fiber 40.

Further, the coupler 50 may be fitted into or adhered to the extended portion 79. The coupler 50 may be provided integrally with the optical fiber holder 51. An optical fiber insertion hole 53 penetrates the optical fiber holder 51 in the axial direction. The optical fiber 40 is inserted in the optical fiber insertion hole 53 and coupled to the optical fiber holder 51. At this time, the end of the optical fiber 40 is positioned at a point on which the light from the lens 60 is converged. When the position of the optical fiber 40 is set, the optical fiber holder 51 and the optical fiber 40 are fixed to each other.

Figure 8:
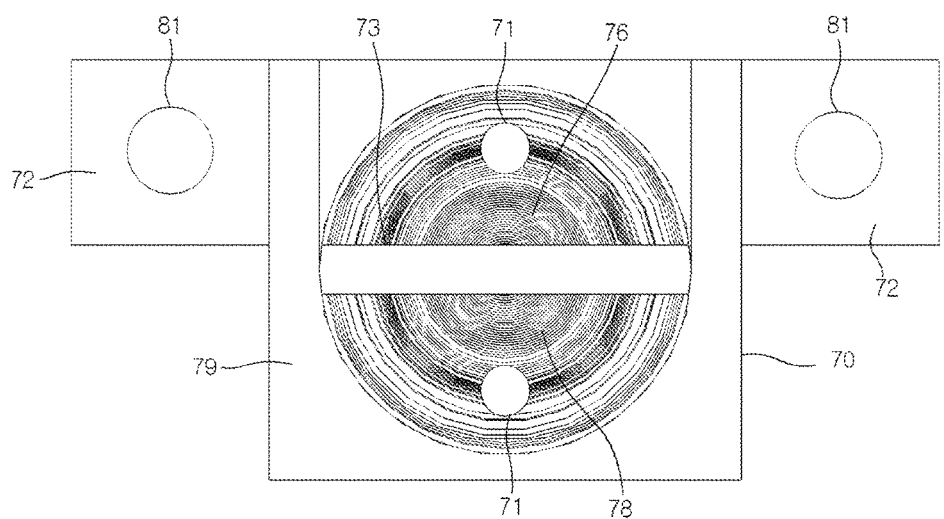
FIG. 8 is a rear view of the mirror unit according to an exemplary embodiment.

FIG. 8 is a rear view of the mirror unit according to an exemplary embodiment. The upper mirror portion 75 and the lower mirror portion 77 are formed with the upper mirror surface 76 and the lower mirror surface 78 having parabolic shapes, respectively. The upper mirror surface 76 and the lower mirror surface 78 are provided to reflect light from a sample 90 toward the lens mounting portion 74. There is a through space in between the upper and lower mirror surfaces 76 and 78 and the lens mounting portion 74.

With the foregoing structure, the holder device for an electron microscope according to an exemplary embodiment has a function of condensing light.

A process of collecting cathodoluminescence caused by collision between an electron beam and a sample 90 is as follows. First, in an idle position where the sample mounting portion 35 is separated from the mirror unit 70, a sample 90 to be analyzed is mounted to the sample mounting portion 35 and fixed by the sample arrangement pin 91 as shown in FIG. 2. Then, as shown in FIG. 3, the mirror unit 70 is moved to an inspection position so that the sample mounting portion 35 can be positioned inside the mirror unit 70 so that the sample 90 can be placed on the same line as the electron through hole 71 in the height direction. To move the mirror unit 70, the optical fiber 40 extended to the exterior of the electron microscope is controlled in the holder grip 11 so that the coupler 50 coupled to the optical fiber 40 can move with respect to the frame 20 in the axial direction.

Then, the electron microscope is controlled to emit the electron beam toward the electron through hole 71. The electron beam passes through the electron through hole 71 and then collides with the sample 90. Thus, light is emitted while electrons move between energy band gaps of the sample 90.

Figure 9:
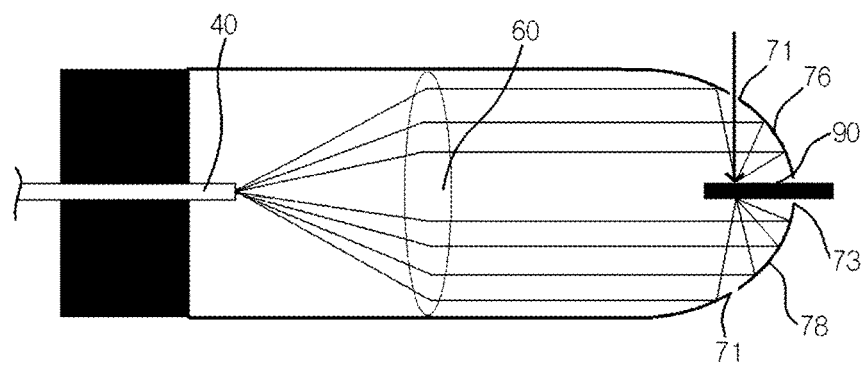
FIG. 9 is an optical concept view for explaining a light condensing mechanism of the holder device for the electron microscope according to an exemplary embodiment.

FIG. 9 is an optical concept view for explaining a light condensing mechanism of the holder device for the electron microscope according to an exemplary embodiment. As shown in FIG. 9, cathodoluminescence emitted from a sample 90 is reflected from the upper and lower mirror surfaces 76 and 78 surrounding the sample 90 toward the lens 60. Then, the lens 60 condenses the cathodoluminescence on the end surface of the optical fiber 40. Thus, the cathodoluminescence emitted from the sample 90 is collected in the optical fiber 40. The optical fiber 40 transmits the collected cathodoluminescence to an external analysis device.

Further, if various experiments for an X-ray analysis, an analysis using secondary electrons and back electrons 2, etc. are additionally needed, the mirror unit 70 is moved to the position separated from the sample mounting portion 35 as shown in FIG. 2 and then the experiments are carried out.

What is claimed is:

1. A holder device for an electron microscope adapted to collect cathodoluminescence from a sample, the device comprising:
    a frame;
    a sample support block coupled to the frame and comprising a sample mounting portion to have a sample mounted to the sample support block; and
    a mirror unit comprising a mirror adapted to reflect cathodoluminescence light radiating from the sample, which is mounted to the sample mounting portion and to which an electron beam is emitted, in a predetermined direction;
    a condensing lens mounted to the mirror unit and configured to condense the cathodoluminescence light from the mirror unit on an optical fiber configured to collect the cathodoluminescence light from the condensing lens.

2. The holder device for an electron microscope according to claim 1, wherein the mirror unit comprises an upper mirror and a lower mirror respectively arranged above and below the sample, and a sample approach slit provided in between the upper mirror and the lower mirror for allowing the sample mounting portion to move in and out along a surface of the sample.

3. The holder device for an electron microscope according to claim 2, wherein the mirror unit comprises an electron through hole via which the electron beam emitted to the sample passes.

4. The holder device for an electron microscope according to claim 1, further comprising:
    an optical fiber holder configured to hold the optical fiber; and
    a coupler configured to couple the optical fiber holder and the mirror unit.

5. The holder device for an electron microscope according to claim 4, wherein the coupler is movably supported on the frame so that the mirror unit can reciprocate between an inspection position where the sample mounting portion is placed within the mirror unit and an idle position where the sample mounting portion is separated from the mirror unit.

6. The holder device for an electron microscope according to claim 1, wherein a slide pin extended in parallel with a lengthwise direction of the frame is coupled to the mirror unit and the sample support block to guide the mirror unit to slidably move relative to the sample support block.

7. The holder device for an electron microscope according to claim 6, further comprising:
    a support rod having one end portion to which the frame is detachably coupled and an axial hole through which the optical fiber passes; and
    a grip portion provided at the other end portion of the support rod.

* * * * *